(12) United States Patent
Kurokawa et al.

(10) Patent No.: US 9,916,933 B2
(45) Date of Patent: Mar. 13, 2018

(54) CERAMIC ELECTRONIC COMPONENT

(71) Applicant: Murata Manufacturing Co., Ltd., Nagaokakyo-shi, Kyoto-fu (JP)

(72) Inventors: Kazuki Kurokawa, Nagaokakyo (JP); Hirobumi Adachi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/623,757

(22) Filed: Jun. 15, 2017

(65) Prior Publication Data

US 2017/0287644 A1    Oct. 5, 2017

Related U.S. Application Data

(63) Continuation of application No. 15/456,695, filed on Mar. 13, 2017, now Pat. No. 9,818,546, which is a
(Continued)

(30) Foreign Application Priority Data

Oct. 7, 2014    (JP) ................. 2014-206320

(51) Int. Cl.
| | |
|---|---|
| *H01L 41/08* | (2006.01) |
| *H01G 4/30* | (2006.01) |
| *H01L 41/083* | (2006.01) |
| *H01F 27/28* | (2006.01) |
| *H01G 4/008* | (2006.01) |
| *H01C 1/14* | (2006.01) |

(Continued)

(52) U.S. Cl.
CPC ............... *H01G 4/30* (2013.01); *H01C 1/14* (2013.01); *H01C 7/008* (2013.01); *H01F 27/2804* (2013.01); *H01F 27/29* (2013.01); *H01G 4/0085* (2013.01); *H01G 4/12* (2013.01); *H01G 4/248* (2013.01); *H01L 41/0472* (2013.01); *H01L 41/083* (2013.01); *H01L 41/1876* (2013.01); *H01L 41/297* (2013.01); *H01F 2027/2809* (2013.01); *H01G 4/1227* (2013.01)

(58) Field of Classification Search
CPC . H01L 41/047; H01L 41/0472; H01L 41/083; H01L 41/1876
USPC ......................... 310/328, 365, 366
See application file for complete search history.

(56) References Cited

U.S. PATENT DOCUMENTS

| | | | |
|---|---|---|---|
| 2013/0107422 A1* | 5/2013 | Lee ..................... | H01C 7/10 361/321.2 |
| 2013/0119827 A1* | 5/2013 | Kang ..................... | H01B 3/12 310/363 |

OTHER PUBLICATIONS

Kurokawa et al., "Ceramic Electronic Component", U.S. Appl. No. 15/691,833, filed Aug. 31, 2017.
(Continued)

*Primary Examiner* — Derek Rosenau
(74) *Attorney, Agent, or Firm* — Keating & Bennett, LLP

(57) ABSTRACT

A ceramic electronic component includes a laminated body including ceramic layers and conductor layers stacked alternately; and first and second external electrodes provided on portions of the laminated body. Each of the first and second external electrodes includes a sintered metal layer provided on the laminated body, a conductive resin layer covering the sintered metal layer, and a plated layer covering the conductive resin layer. The maximum length of the sintered metal layer provided on the second principal surface is shorter than the maximum length of the sintered metal layer provided on each of the first and second side surfaces.

20 Claims, 7 Drawing Sheets

Related U.S. Application Data continuation of application No. 14/868,882, filed on Sep. 29, 2015.

(51) Int. Cl.
    *H01C 7/00*     (2006.01)
    *H01F 27/29*     (2006.01)
    *H01G 4/248*     (2006.01)
    *H01L 41/047*     (2006.01)
    *H01L 41/187*     (2006.01)
    *H01L 41/297*     (2013.01)
    *H01G 4/12*     (2006.01)

(56) References Cited

OTHER PUBLICATIONS

Kurokawa et al., "Ceramic Electronic Component", U.S. Appl. No. 14/868,882, filed Sep. 29, 2015.
Kurokawa et al., "Ceramic Electronic Component", U.S. Appl. No. 15/456,692, filed Mar. 13, 2017.
Kurokawa et al., "Ceramic Electronic Component", U.S. Appl. No. 15/456,695, filed Mar. 13, 2017.
Kurokawa et al., "Ceramic Electronic Component", U.S. Appl. No. 15/609,283, filed May 31, 2017.

\* cited by examiner

CERAMIC ELECTRONIC COMPONENT

BACKGROUND OF THE INVENTION

1. Field of the Invention

The present invention relates to a ceramic electronic component.

2. Description of the Related Art

In recent years, ceramic electronic components typified by multilayer ceramic capacitors have been used under more inhospitable environments than ever before.

For example, electronic components for use in mobile devices such as cellular phones and portable music player are required to withstand dropping impacts. Specifically, the electronic components are required to keep from dropping from mounting boards and keep themselves from being cracked, when the electronic components are subjected to dropping impacts.

Furthermore, electronic components for use in in-car devices such as an ECU (Engine Control Unit) are required to withstand thermal cycle impacts. Specifically, the electronic components are required to keep solder used to mount the components and the components themselves from being cracked when the components are subjected to deflection stress generated by thermal expansion and contraction of the mounting boards due to thermal cycles.

In order to deal with these demands, Japanese Patent Application Laid-Open No. 11-162771 discloses a multilayer ceramic capacitor which includes external electrodes obtained by sequentially stacking a sintered electrode layer, a conductive resin layer including metal powder, a Ni plated layer, and a Sn plated layer.

The sintered electrode layer (sintered metal layer) is formed by baking a conductive paste applied to a laminated body. Shrinkage of a sintered metal powder included in the conductive paste concentrically generates residual stress on portions of the laminated body in contact with an end of the sintered metal layer. When the multilayer ceramic capacitor mounted on a circuit board is subjected to an external force, a combination of residual stress and external stress may be concentrically loaded on portions of the laminated body in contact with ends of the sintered metal layers of the external electrodes on the side opposed to the circuit board, thereby resulting in crack generation.

While the multilayer ceramic capacitor disclosed in Japanese Patent Application Laid-Open No. 11-162771 causes the epoxy-based thermosetting resin layer to absorb residual stress generated on the laminated body for the purpose of suppressing crack generation, there is room to be able to further suppress crack generation by reducing residual stress generated on portions of the laminated body on which a combination of residual stress and external stress is concentrically loaded.

SUMMARY OF THE INVENTION

Preferred embodiments of the present invention provide a ceramic electronic component and a manufacturing method therefor, which prevent a laminated body from being cracked by reducing residual stress generated in portions of the laminated body on which a combination of residual stress and external stress is concentrically loaded.

A ceramic electronic component according to a preferred embodiment of the present invention includes a laminated body including a plurality of ceramic layers and a plurality of conductor layers that are stacked alternately; and first and second external electrodes provided on portions of the laminated body, and electrically connected to at least some conductor layers of the plurality of conductor layers. The laminated body includes a first end surface and a second end surface opposing each other in a length direction, a first principal surface and a second principal surface opposing each other in a height direction to connect the first end surface and the second end surface, and a first side surface and a second side surface opposing each other in a width direction to connect the first principal surface and the second principal surface and connect the first end surface and the second end surface. The height of the laminated body in the height direction is larger than the width of the laminated body in the width direction. The first and second external electrodes each includes a sintered metal layer provided on the laminated body, a conductive resin layer containing a mixture of a resin and a metal, which covers the sintered metal layer, and a plated layer which covers the conductive resin layer. The first external electrode extends from the first end surface to at least a portion of the second principal surface, a portion of first side surface, and a portion of second side surface. The second external electrode extends from the second end surface to at least a portion of the second principal surface, a portion of first side surface, and a portion of second side surface. In the length direction, the maximum length of the sintered metal layer provided on the second principal surface is shorter than the maximum length of the sintered metal layer provided on each of the first side surface and second side surface.

In a preferred embodiment of the present invention, the conductive resin layer contains Cu or Ag.

In a preferred embodiment of the present invention, the sintered metal layer contains Cu.

In a preferred embodiment of the present invention, the plated layer includes a Ni plated layer that covers the conductive resin layer, and a Sn plated layer that covers the Ni plated layer.

In a preferred embodiment of the present invention, the maximum length of the sintered metal layer provided on the second principal surface preferably is shorter by about 20 µm or more, for example, than the maximum length of the sintered metal layer provided on each of the first side surface and second side surface.

A method for manufacturing a ceramic electronic component according to another preferred embodiment of the present invention includes the steps of preparing a laminated body including a plurality of ceramic layers and a plurality of conductor layers that are stacked alternately; and providing first and second external electrodes on portions of the laminated body to be electrically connected to at least some conductor layers of the plurality of conductor layers. The laminated body has a first end surface and a second end surface opposing each other in a length direction, a first principal surface and a second principal surface opposing each other in a height direction to connect the first end surface and the second end surface, and a first side surface and a second side surface opposing each other in a width direction to connect the first principal surface and the second principal surface and connect the first end surface and the second end surface. The height of the laminated body in the height direction is larger than the width of the laminated body in the width direction. The step of providing the first and second external electrodes includes the steps of: applying a conductive paste from the first end surface to at least a portion of the second principal surface, a portion of the first side surface, and a portion of the second side surface; applying the conductive paste from a portion of the second end surface to at least a portion of the second principal surface, a portion of the first side surface, and a portion of the second side surface; providing sintered metal layers by heating the laminated body with the conductive paste applied to portions of the first end surface and the second end surface; applying a conductive resin paste that is a mixture of a resin component and a metal component, so as to cover the sintered metal layers; providing a conductive resin layer by heating the laminated body with the conductive resin paste applied; and carrying out plating so as to cover the conductive resin layer. The method for manufacturing the ceramic electronic component further includes, before the step of providing the first and second external electrodes, a step of forming a lipophobic film on only portions of the first principal surface and the second principal surface, or on only a portion of the second principal surface.

In a preferred embodiment of the present invention, the conductive resin paste contains Cu or Ag.

In a preferred embodiment of the present invention, the conductive paste contains Cu.

In a preferred embodiment of the present invention, the plating step includes the steps of: carrying out Ni plating so as to cover the conductive resin layers, and carrying out Sn plating after the step of carrying out Ni plating.

According to various preferred embodiments of the present invention, the laminated body is prevented from being cracked by reducing residual stress generated in portions of the laminated body on which a combination of residual stress and external stress is concentrically loaded.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Ceramic electronic components according to preferred embodiments of the present invention will be described below with reference to the drawings.

In the following description of the preferred embodiments, the same or corresponding elements in the figures will be denoted by the same reference numbers, and descriptions of the elements will not be repeated. While a ceramic capacitor will be described as the ceramic electronic component in the following descriptions, the electronic component is not limited to the capacitor, but encompasses a piezoelectric component, a thermistor, or an inductor.

Figure 1:
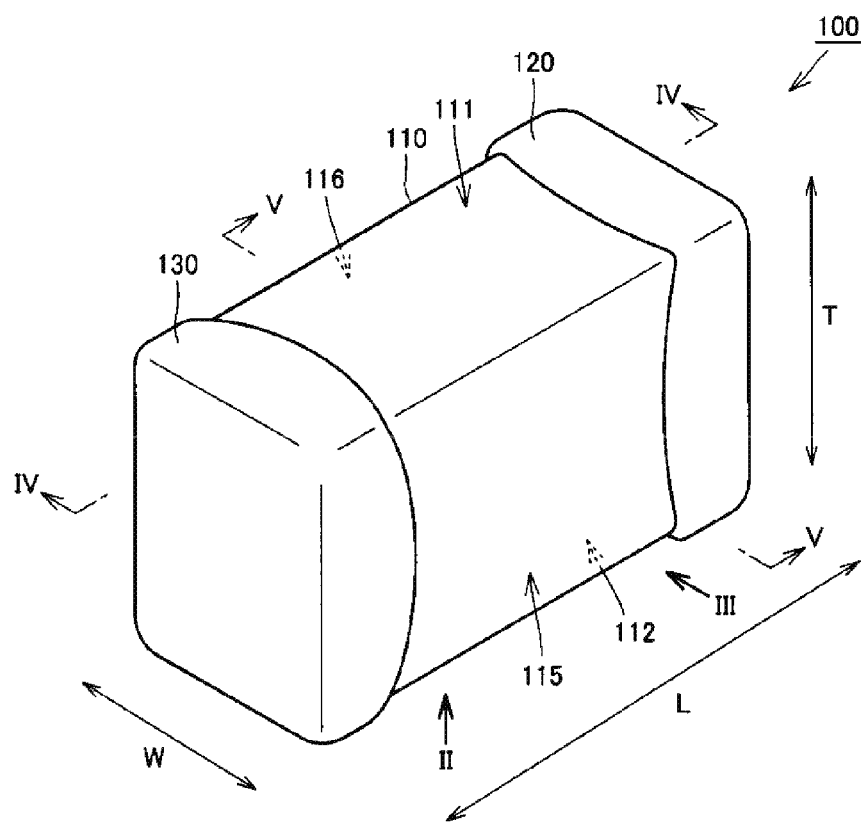
FIG. 1 is a perspective view illustrating the appearance of a ceramic electronic component according to a preferred embodiment of the present invention.
Figure 2:
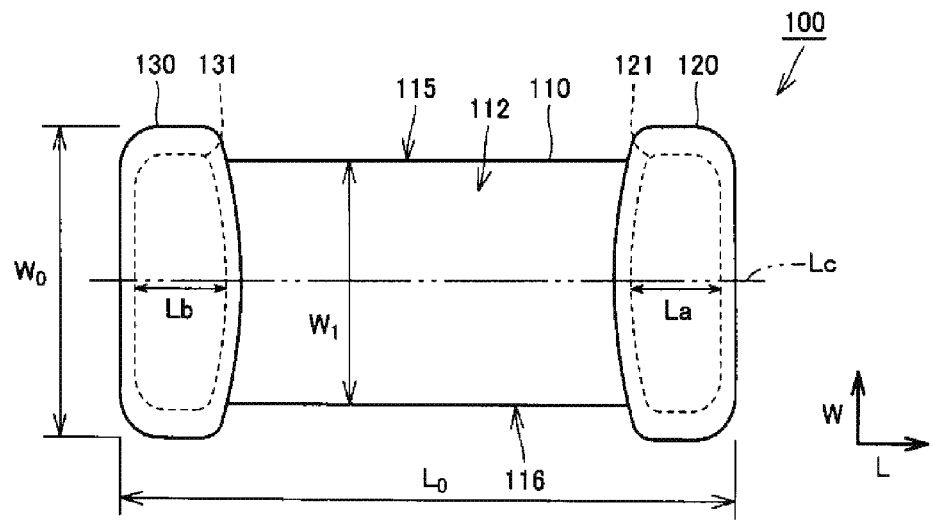
FIG. 2 is a plan view of the ceramic electronic component as viewed from a direction of arrow II in FIG. 1.
Figure 3:
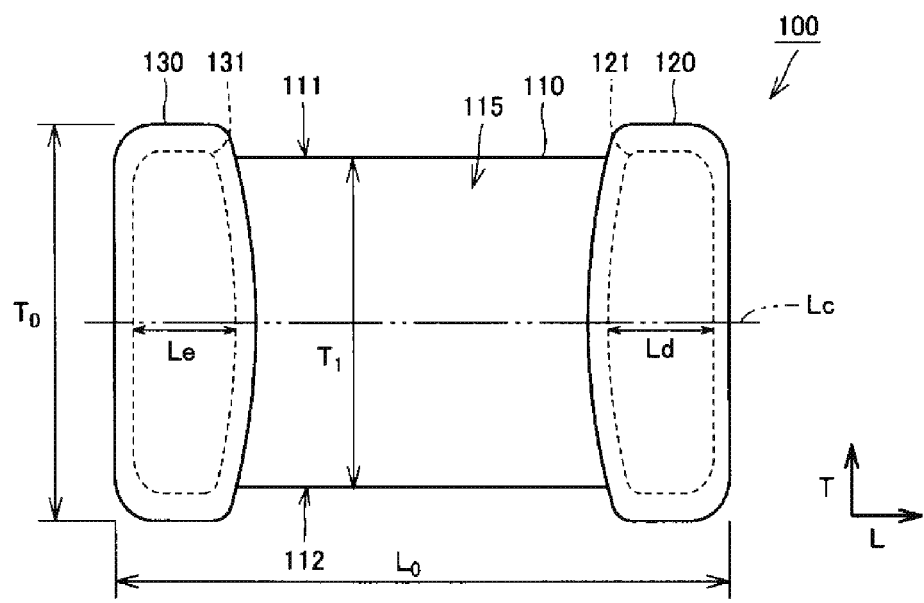
FIG. 3 is a side view of the ceramic electronic component as viewed from a direction of arrow III in FIG. 1.
Figure 4:
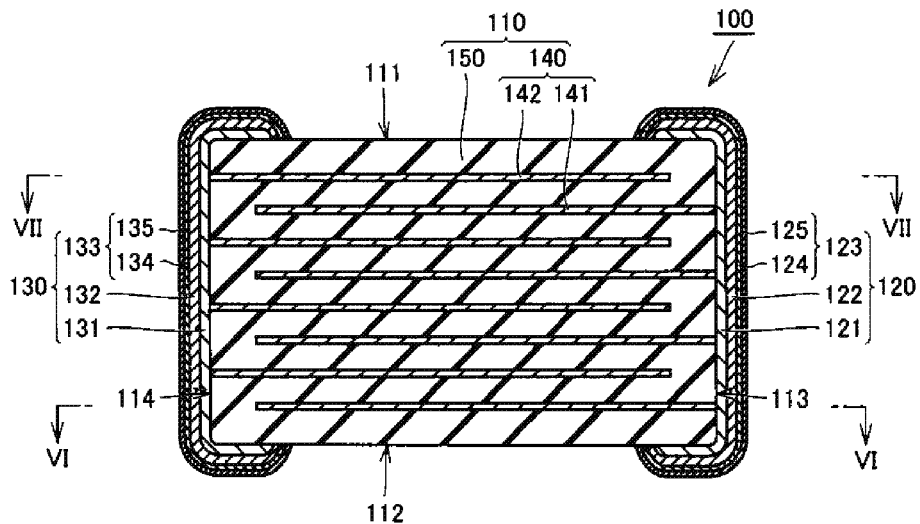
FIG. 4 is a cross-sectional view of the ceramic electronic component as viewed from an arrow direction of line IV-IV in FIG. 1.
Figure 5:
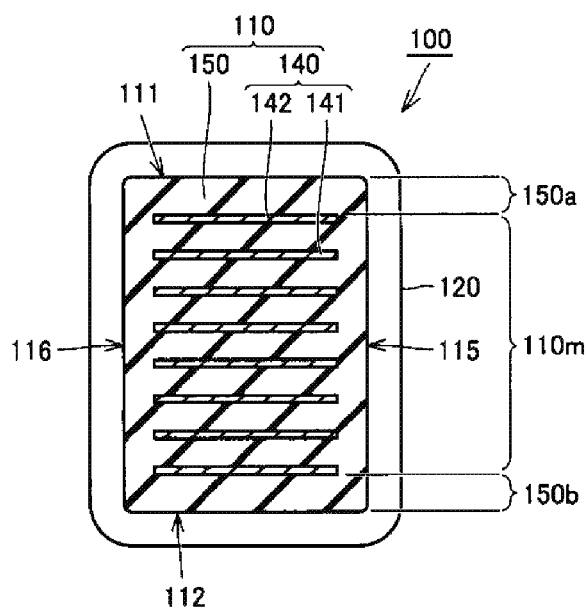
FIG. 5 is a cross-sectional view of the ceramic electronic component as viewed from an arrow direction of line V-V in FIG. 1.
Figure 6:
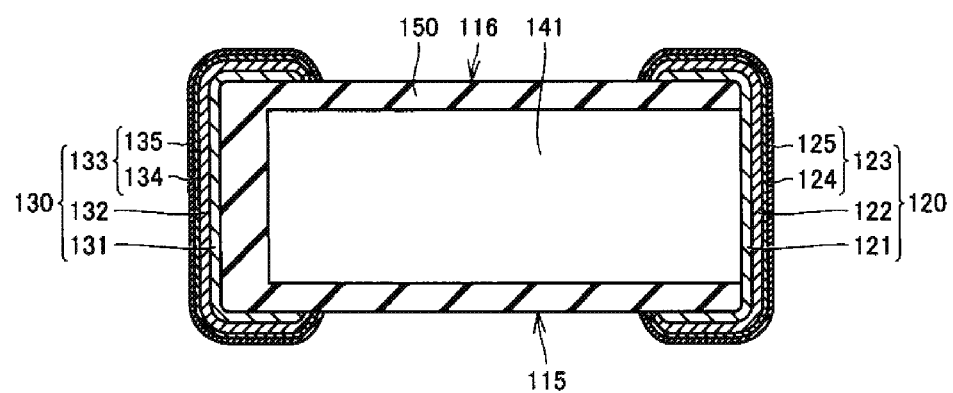
FIG. 6 is a cross-sectional view of the ceramic electronic component as viewed from an arrow direction of line VI-VI in FIG. 4.
Figure 7:
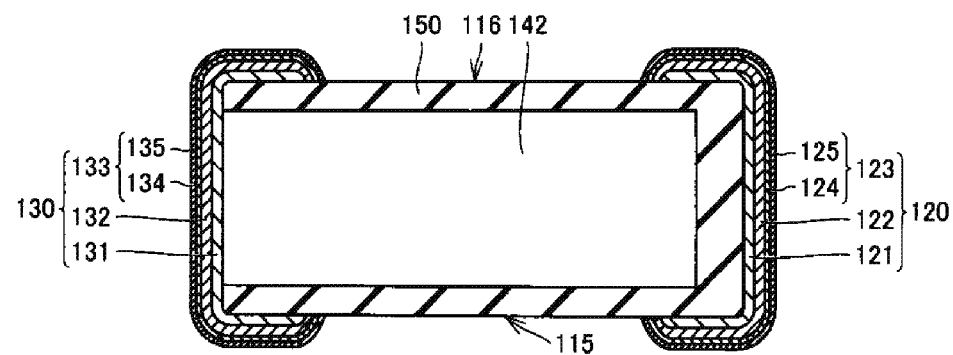
FIG. 7 is a cross-sectional view of the ceramic electronic component as viewed from an arrow direction of line VII-VII in FIG. 4.

FIG. 1 is a perspective view illustrating the appearance of a ceramic electronic component according to a preferred embodiment of the present invention. FIG. 2 is a plan view of the ceramic electronic component as viewed from a direction of arrow II in FIG. 1. FIG. 3 is a side view of the ceramic electronic component as viewed from a direction of arrow III in FIG. 1. FIG. 4 is a cross-sectional view of the ceramic electronic component as viewed from an arrow direction of line IV-IV in FIG. 1. FIG. 5 is a cross-sectional view of the ceramic electronic component as viewed from an arrow direction of line V-V in FIG. 1. FIG. 6 is a cross-sectional view of the ceramic electronic component as viewed from an arrow direction of line VI-VI in FIG. 4. FIG. 7 is a cross-sectional view of the ceramic electronic component as viewed from an arrow direction of line VII-VII in FIG. 4. In FIG. 1, the length direction of the laminated body described below is denoted by L, the width direction of the laminated body is denoted by W, and the height direction of the laminated body is denoted by T.

As shown in FIGS. 1 to 7, a ceramic electronic component 100 according to a preferred embodiment of the present invention includes a cuboidal laminated body 110 including a plurality of ceramic layers (dielectric layers) 150 stacked and a plurality of conductor layers 140, and a pair of external electrodes provided on both ends of the laminated body 110.

In the present preferred embodiment, the direction of stacking the plurality of dielectric layers 150 and the plurality of conductor layers 140 is orthogonal to the length direction L of the laminated body 110 and the width direction W of the laminated body 110. More specifically, the direction of stacking the plurality of dielectric layers 150 and the plurality of conductor layers 140 is parallel to the height direction T of the laminated body 110. However, the direction of stacking the plurality of dielectric layers 150 and the plurality of conductor layers 140 may be parallel to the width direction W of the laminated body 110.

The laminated body 110 includes a first end surface 113 and a second end surface 114 located on the opposite side of the laminated body 110 from each other, a first principal surface 111 and a second principal surface 112 located on the opposite side of the laminated body 110 from each other to connect the first end surface 113 and the second end surface 114, and a first side surface 115 and a second side surface 116 located on the opposite side of the laminated body 110 from each other to connect the first principal surface 111 and the second principal surface 112 and connect the first end surface 113 and the second end surface 114. The second principal surface 112 is a surface that is opposed to a circuit board when the ceramic electronic component 100 is mounted on the circuit board.

The height $T_1$ of the laminated body 110 in the direction of connecting the first principal surface 111 and the second principal surface 112 at the shortest distance (the height direction T of the laminated body 110) is larger than the width $W_1$ of the laminated body 110 in the direction of connecting the first side surface 115 and the second side surface 116 at the shortest distance (the width direction W of the laminated body 110). The width $W_1$ of the laminated body 110 is smaller than the length of the laminated body 110.

The laminated body 110 preferably has a cuboidal outline, but may have at least one of corners and ridges rounded. In addition, any of the first and second principal surfaces 111, 112, the first and second end surfaces 113, 114, and the first and second side surfaces 115, 116 may contain asperities.

The laminated body 110 preferably includes an inner layer portion 110m including the layers from the conductor layer 140 located closest to the first principal surface 111 among the plurality of conductor layers 140 to the conductor layer 140 located closest to the second principal surface 112 among the plurality of the conductor layers 140, in the direction of stacking the laminated body 110; and a first outer layer portion 150a and a second outer layer portion 150b that sandwich the inner layer portion 110m therebetween.

In the inner layer portion 110m, some dielectric layers 150 of the plurality of dielectric layers 150 and all of the conductor layers 140 are stacked in such a way that the dielectric layers 150 and the conductor layers 140 are alternately stacked. More specifically, the inner layer portion 110m includes all of the conductor layers 140. All of the conductor layers 140 are each preferably rectangular or substantially rectangular in planar view.

The first outer layer portion 150a includes the dielectric layer 150 located closest to the first principal surface 111 among the plurality of dielectric layers 150. The second outer layer portion 150b includes the dielectric layer 150 located closest to the second principal surface 112 among the plurality of dielectric layers 150.

One of the pair of external electrodes is a first external electrode 120 provided on one end of the laminated body 110 in the length direction L, whereas the other of the pair of external electrodes is a second external electrode 130 provided on the other end of the laminated body 110 in the length direction L.

Specifically, the first external electrode 120 is provided on the first end surface 113 of the laminated body 110, whereas the second external electrode 130 is provided on the second end surface 114 of the laminated body 110. In the present preferred embodiment, the first external electrode 120 extends from the first end surface 113 to at least a portion of the first principal surface 111, a portion of the second principal surface 112, a portion of the first side surface 115, and a portion of the second side surface 116. The second external electrode 130 extends from the second end surface 114 to at least a portion of the first principal surface 111, a portion of second principal surface 112, a portion of first side surface 115, and a portion of second side surface 116.

However, the location of the pair of external electrodes is not limited to the foregoing, but what is preferred is that the first external electrode 120 extends from the first end surface 113 to at least a portion of the second principal surface 112, a portion of the first side surface 115, and a portion of the second side surface 116, whereas the second external electrode 130 extends from the second end surface 114 to at least a portion of of the second principal surface 112, a portion of the first side surface 115, and a portion of the second side surface 116.

The first conductor layer 141 of the conductor layers 140 adjacently opposed to each other is electrically connected to the first external electrode 120 at the first end surface 113, whereas the second conductor layer 142 is electrically connected to the second external electrode 130 at the second end surface 114.

While all of the conductor layers 140 preferably are electrically connected to the first external electrode 120 or the second external electrode 130 in the present preferred embodiment, the present invention is not limited to this preferred embodiment, but what is needed is that at least some conductor layers 140 of the plurality of conductor layers 140 are electrically connected to the pair of external electrodes. More specifically, the plurality of conductor layers 140 may include conductor layers 140 that are not electrically connected to the pair of external electrodes.

The ceramic electronic component 100 has external dimensions of: length $L_0$; width $W_0$; and height $T_0$ that are defined by the pair of external electrodes.

The respective elements will be described below in detail.

Dielectric ceramics containing $BaTiO_3$, $CaTiO_3$, $SrTiO_3$, $CaZrO_3$, or the like as a main constituent can be used as a material constituting the dielectric layers 150. In addition, materials may be used which are obtained by adding, to any of the main constituents, a Mn compound, a Fe compound, a Cr compound, a Co compound, a Ni compound, or the like as an accessory constituent.

It is to be noted that when the electronic component is a piezoelectric component, the dielectric layers 150 can be composed of a piezoelectric ceramic. Examples of the piezoelectric ceramic include, for example, a PZT (lead zirconate titanate) based ceramic.

When the electronic component is a thermistor, the dielectric layers 150 can be composed of a semiconductor ceramic. Examples of the semiconductor ceramic include, for example, a spinel-based ceramic.

When the electronic component is an inductor, the dielectric layers 150 can be composed of a magnetic ceramic. Examples of the magnetic ceramic include, for example, a ferrite ceramic.

The thickness of each dielectric layer 150 included in the inner layer portion 110m is preferably about 0.5 μm or more and about 10 μm or less, for example. The height of the second outer layer portion 150b is preferably larger than the height of the first outer layer portion 150a. In this case, if a crack is generated from the second principal surface 112 of the laminated body 110, the crack is prevented from reaching the inner layer portion 110m. The height of the second outer layer portion 150b is preferably about 30 μm or more, for example.

In addition, the second outer layer portion 150b may include an outside outer layer portion including the dielectric layer 150 located closest to the second principal surface 112 among the plurality of dielectric layers 150, and an inside outer layer portion including the dielectric layer 150 located adjacent to a surface of the outside outer layer portion closer to the first principal surface 111. The height of the inside outer layer portion may be equal to or less than the height of the first outer layer portion 150a.

The constituent contained in the dielectric layer constituting the outside outer layer portion preferably includes more Si, as compared with the constituent contained in the dielectric layer constituting the inside outer layer portion. In addition, the height of the outside outer layer portion is preferably larger than the height of the inside outer layer portion. In this case, because the dielectric layer with a higher Si content ratio has a higher heat shrinkage ratio in firing, the heat shrinkage ratio in firing becomes higher in the outside outer layer portion than in the inside outer layer portion. As a result, the heat shrinkage ratio of the outside outer layer portion is closer to the heat shrinkage ratio of the conductor layers 140 in the inner layer portion 110m.

Therefore, because internal stress that acts on the boundary between the inner layer portion 110m and the second outer layer portion 150b is relaxed due to a difference in heat shrinkage ratio between the dielectric layer 150 and the conductor layer 140 in firing, a crack (delamination) is prevented from being generated at the boundary between the inner layer portion 110m and the second outer layer portion 150b.

Furthermore, the Si content ratio is preferably higher at the boundary portion between the outside outer layer portion and the inside outer layer portion, as compared with a central portion of the outside outer layer portion. In this case, when the laminated body 110 is subjected to firing, Si segregated from grain boundaries of ceramic grains can fill a large number of minute gaps present at the interface between the outside outer layer portion and the inside outer layer portion to improve the adhesion between the outside outer layer portion and the inside outer layer portion. As a result, if a crack is generated from the second principal surface 112 of the laminated body 110, the crack is prevented from reaching the inner layer portion 110m by preventing crack development or changing the direction of crack development at the boundary portion of the outside outer layer portion with the inside outer layer portion.

The first conductor layers 141 and the second conductor layers 142 are alternately arranged at regular intervals in the height direction T of the laminated body 110. The first conductor layers 141 and the second conductor layers 142 are each preferably about 0.2 μm or more and about 2.0 μm or less in thickness, for example.

The first conductor layers 141 extend from the first end surface 113 toward the second end surface 114.

The second conductor layers 142 extend from the second end surface 114 toward the first end surface 113.

Metals such as Ni, Cu, Ag, Pd, and Au, or alloys containing at least one of the metals, for example, an alloy of Ag and Pd can be used as the material constituting the conductor layer 140.

The first external electrode 120 preferably includes a first sintered metal layer 121 provided on the laminated body 110; a first conductive resin layer 122 including a mixture of a resin component and a metal component, which covers the first sintered metal layer 121; and a first plated layer 123 which covers the first conductive resin layer 122.

The second external electrode 130 includes a second sintered metal layer 131 provided on the laminated body 110; a second conductive resin layer 132 including a mixture of a resin component and a metal component, which covers the second sintered metal layer 131; and a second plated layer 133 which covers the second conductive resin layer 132.

The first sintered metal layer 121 extends from the first end surface 113 to respective portions of the first principal surface 111, second principal surface 112, first side surface 115, and second side surface 116. The second sintered metal layer 131 extends from the second end surface 114 to respective portions of the first principal surface 111, second principal surface 112, first side surface 115, and second side surface 116. The first and second sintered metal layers 121, 131 are each preferably about 10.0 μm or more and about 50.0 μm or less in thickness, for example.

In the direction connecting the first end surface 113 and the second end surface 114 at the shortest distance (the length direction L of the laminated body 110), the maximum length La of the first sintered metal layer 121 provided on the second principal surface 112 is shorter than the maximum length Ld of the first sintered metal layer 121 provided on each of the first side surface 115 and second side surface 116.

Preferably, in the direction connecting the first end surface 113 and the second end surface 114 at the shortest distance (the length direction L of the laminated body 110), the maximum length La of the first sintered metal layer 121 provided on the second principal surface 112 is shorter by about 20 μm or more, for example, than the maximum length Ld of the first sintered metal layer 121 provided on each of the first side surface 115 and second side surface 116.

In the direction connecting the first end surface 113 and the second end surface 114 at the shortest distance (the length direction L of the laminated body 110), the maximum length Lb of the second sintered metal layer 131 provided on the second principal surface 112 is shorter than the maximum length Le of the second sintered metal layer 131 provided on each of the first side surface 115 and the second side surface 116.

Preferably, in the direction connecting the first end surface 113 and the second end surface 114 at the shortest distance (the length direction L of the laminated body 110), the maximum length Lb of the second sintered metal layer 131 provided on the second principal surface 112 is shorter by about 20 μm or more, for example, than the maximum length Le of the second sintered metal layer 131 provided on each of the first side surface 115 and the second side surface 116.

The maximum length La of the first sintered metal layer 121 and the maximum length Lb of the second sintered metal layer 131 are each preferably about 5 μm or more and about 110 μm or less, for example. The maximum length Ld of the first sintered metal layer 121 and the maximum length Le of the second sintered metal layer 131 are each preferably about 25 μm or more and about 145 μm or less, for example.

The first and second sintered metal layers 121, 131 each contain a metal component and a glass component. Metals such as Ni, Cu, Ag, Pd, and Au, or alloys containing at least one of the metals, for example, an alloy of Ag and Pd can be used as the metal component. Glass containing B, Si, Ba, Mg, Al, Li, or the like can be used as the glass component.

The first conductive resin layer 122 covers the entire outer surface of the first sintered metal layer 121. The second conductive resin layer 132 covers the entire outer surface of the second sintered metal layer 131. The first and second conductive resin layers 122, 132 are each preferably about 10.0 μm or more and about 150.0 μm or less in thickness, for example.

In the direction connecting the first end surface 113 and the second end surface 114 at the shortest distance (the length direction L of the laminated body 110), the maximum length of the first conductive resin layer 122 provided over the second principal surface 112 is shorter than the maximum length of the first conductive resin layer 122 provided over each of the first side surface 115 and the second side surface 116.

In the direction connecting the first end surface 113 and the second end surface 114 at the shortest distance (the length direction L of the laminated body 110), the maximum length of the second conductive resin layer 132 provided over the second principal surface 112 is shorter than the maximum length of the second conductive resin layer 132 provided over each of the first side surface 115 and the second side surface 116.

Metals such as Cu, Ag, and Ni, or alloys containing at least one of the metals can be used as the metal component contained in each of the first and second conductive resin layers 122, 132.

Various known thermosetting resins such as epoxy resins, phenolic resins, urethane resins, silicon resins, and polyimide resins can be used as the resin component contained in each of the first and second conductive resin layers 122, 132. Among these resins, the epoxy resins which have excellent heat resistance, moisture resistance, and adhesion, etc. are preferably used.

In addition, the first and second conductive resin layers 122, 132 each preferably contain a curing agent along with the thermosetting resin. In the case of using an epoxy resin as a base resin, various curing agents can be used such as phenols, amines, acid anhydrides, or imidazoles.

The first and second conductive resin layers 122, 132 each contain the resin component and define and function as a buffer layer. More specifically, when a physical impact or a shock caused by a thermal cycle is applied to the ceramic electronic component 100, the resin components of the respective first and second conductive resin layers 122, 132 absorb the impact or shock. As a result, a solder used to mount the electronic component 100 and the ceramic electronic component 100 itself can be kept from being cracked.

The first plated layer 123 covers the entire outer surface of the first conductive resin layer 122. The second plated layer 133 covers the entire outer surface of the second conductive resin layer 132.

In the direction connecting the first end surface 113 and the second end surface 114 at the shortest distance (the length direction L of the laminated body 110), the maximum length of the first plated layer 123 provided over the second principal surface 112 is shorter than the maximum length of the first plated layer 123 provided over each of the first side surface 115 and the second side surface 116.

In the direction connecting the first end surface 113 and the second end surface 114 at the shortest distance (the length direction L of the laminated body 110), the maximum length of the second plated layer 133 provided over the second principal surface 112 is shorter than the maximum length of the second plated layer 133 provided over each of the first side surface 115 and the second side surface 116.

Metals such as Ni, Cu, Ag, Pd, and Au, or alloys containing at least one of the metals, for example, an alloy of Ag and Pd can be used as the material constituting each of the first and second plated layers 123, 133.

In the present preferred embodiment, the first plated layer 123 includes a first Ni plated layer 124 that covers the first conductive resin layer 122, and a first Sn plated layer 125 that covers the first Ni plated layer 124.

The second plated layer 133 includes a second Ni plated layer 134 that covers the second conductive resin layer 132, and a second Sn plated layer 135 that covers the second Ni plated layer 134.

The first and second Ni plated layers 124, 134 define and function as solder barrier layers. The first and second Sn plated layers 125, 135 make a solder likely to wet the surface of the pair of external electrodes upward in mounting of the ceramic electronic component. The thickness per plated layer is preferably about 1.0 µm or more and about 10.0 µm or less, for example.

Figure 8:
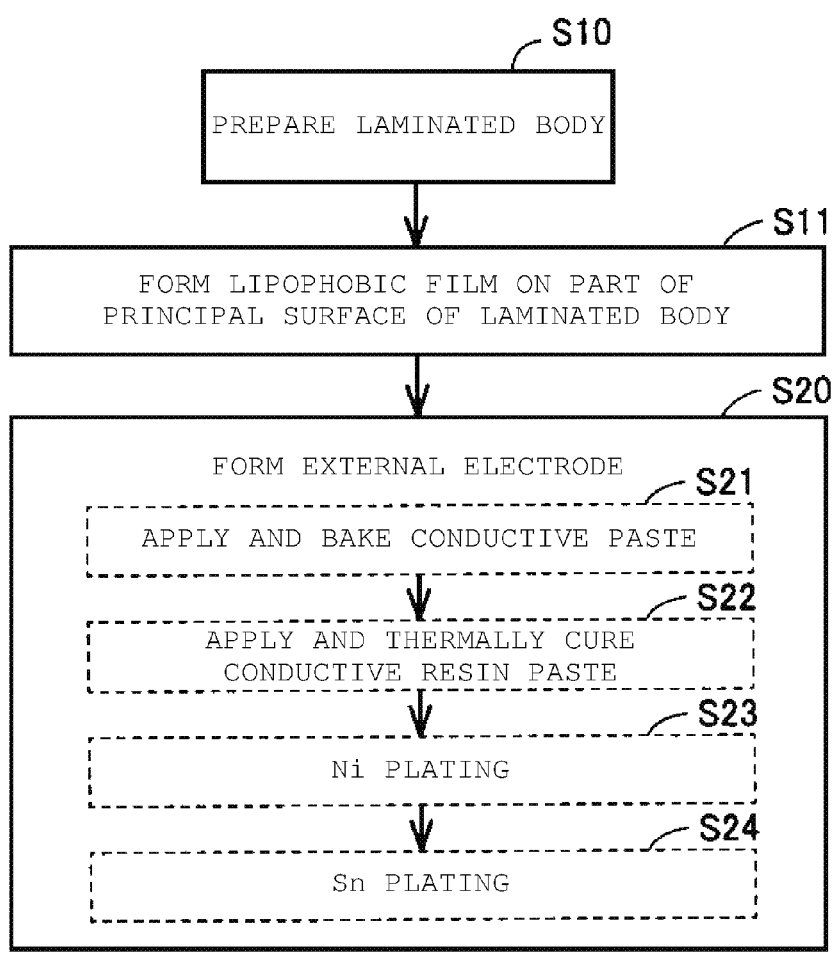
FIG. 8 is a flowchart showing a method for manufacturing a ceramic electronic component according to a preferred embodiment of the present invention.

A non-limiting example of a method for manufacturing a ceramic electronic component according to a preferred embodiment of the present invention will be described below with reference to the drawings. FIG. 8 is a flowchart showing a method for manufacturing a ceramic electronic component according to a preferred embodiment of the present invention.

As shown in FIG. 8, a cuboidal laminated body 110 is prepared which includes a plurality of dielectric layers 150 stacked and a plurality of conductor layers 140 stacked (S10). The laminated body 110 is prepared as follows.

First, a ceramic paste including a ceramic powder is applied in the form of a sheet by a screen printing method or the like, and dried to prepare ceramic green sheets.

As for some of the plurality of ceramic green sheets prepared, a conductive paste for the formation of internal electrodes is applied by a screen printing method onto the ceramic green sheets so as to provide predetermined patterns. In this way, prepared are the ceramic green sheets with conductive patterns formed for serving as internal electrodes and the ceramic green sheets with no conductive patterns formed. It is to be noted that the conductive paste for the formation of internal electrodes and the ceramic paste may include a known binder and a solvent.

A mother laminated body is prepared by stacking a predetermined number of sheets among the ceramic green sheets with no conductive patterns formed, stacking thereon a plurality of ceramic green sheets with the conductive patterns formed, and further stacking a predetermined number of sheets among the ceramic green sheets with no conductive patterns formed. If necessary, the mother laminated body may be pressed in the stacking direction in a way such as isostatic press.

The mother laminated body is cut into a predetermined shape and divided to prepare a plurality of cuboidal soft laminated bodies. It is to be noted that the cuboidal soft laminated bodies may subjected to barrel finishing to round corners of the soft laminated bodies.

The soft laminated body is hardened by firing to prepare the laminated body 110. The firing temperature is appropriately set depending on the types of the ceramic material and conductive material, and set within the range of, for example, 900° C. or higher and 1300° C. or lower.

Next, a lipophobic film is formed on only a portion of the first principal surface 111 and a portion of the second principal surface 112 of the laminated body 110, or on only a portion of the second principal surface 112 (S11). The surface of the laminated body 110 is preferably cleaned before forming the lipophobic film.

The lipophobic film includes a deposited film of fluorine-containing polymer deposited on the surface of the laminated body 110 by turning a gas containing C and F into plasma, a baked film of fluorocarbon-containing polymer, a chemically adsorbed monomolecular film containing fluorine, which is formed with a siloxane linkage, an applied film of fluorine-containing resin, an applied film of silicon-containing resin, or the like.

In the case of composing the lipophobic film of a deposited film of fluorine-containing polymer, fluorocarbon ($C_xF_y$: $y/x \leq 2.5$ met) is preferably used as a raw material gas containing a lipophobic material. When this fluorocarbon is used, a monomer containing CF and $CF_2$ as its main constituent is produced by plasma treatment. The lipophobic film is formed on the surface of the laminated body 110 by depositing a coating agent containing CF and $CF_2$ as monomers on the surface of the laminated body 110. The lipophobic film prevents a conductive paste described below from spreading out on the surface of the laminated body 110.

Figure 9:
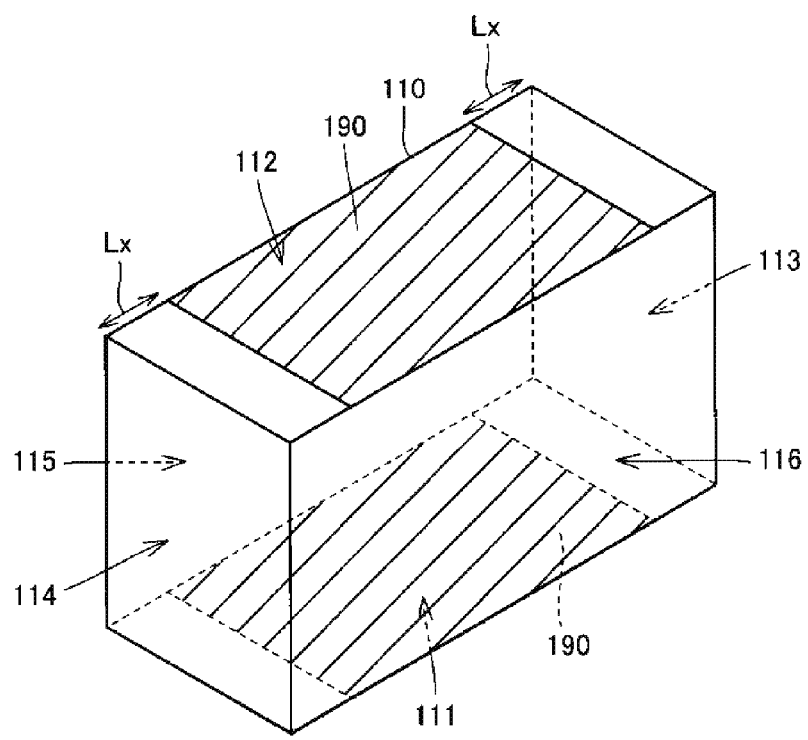
FIG. 9 is a perspective view of lipophobic films formed on only a first principal surface and a second principal surface of a laminated body.

FIG. 9 is a perspective view of lipophobic films formed on only a portion of a first principal surface and a portion of a second principal surface of a laminated body. As shown in FIG. 9, a lipophobic film 190 extends from a position at a distance of length Lx from the first end surface 113, to a position at a distance of length Lx from the second end surface, on each of the first principal surface 111 and the second principal surface 112 of the laminated body 110 in the present preferred embodiment. The length Lx is slightly shorter than the maximum length La of the first sintered metal layer 121 and the maximum length Lb of the second sintered metal layer 131.

However, the lipophobic films 190 may be formed entirely over the first principal surface 111 and the second principal surface 112 of the laminated body 110. In this case, lipophobic films 190 that have relatively low performance in preventing the conductive paste from spreading out are formed entirely over the first principal surface 111 and the second principal surface 112. Alternatively, the lipophobic film 190 may be formed on only the second principal surface 112.

Next, a pair of external electrodes is provided on both ends of the laminated body 110 so as to be electrically connected to at least some conductor layers 140 of the plurality of conductor layers 140 (S20).

First, the conductive paste is applied to both ends of the laminated body 110 with the lipophobic films formed, and baked (S21). The conductive paste includes a metal component and a glass component. Metals such as Ni, Cu, Ag, Pd, and Au, or alloys containing at least one of the metals, for example, an alloy of Ag and Pd can be used as the metal component. Glass containing B, Si, Ba, Mg, Al, Li, or the like can be used as the glass component.

Figure 10:
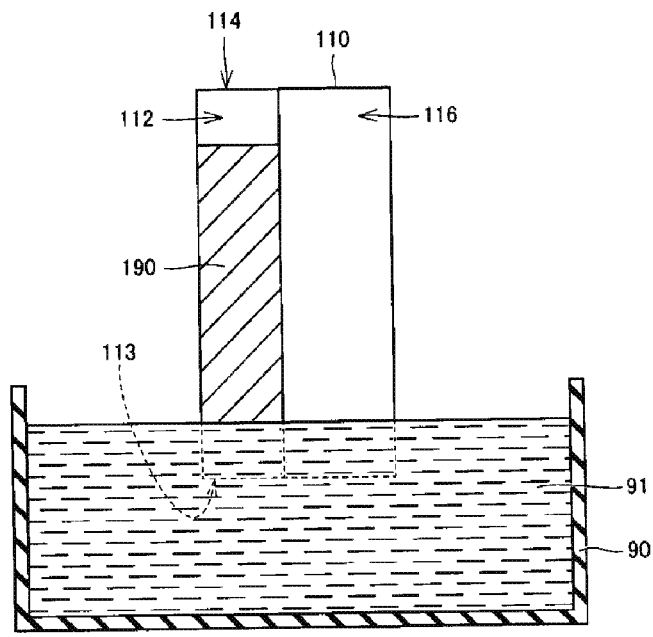
FIG. 10 is a side view illustrating a conductive paste being applied around a first end surface of a laminated body.
Figure 11:
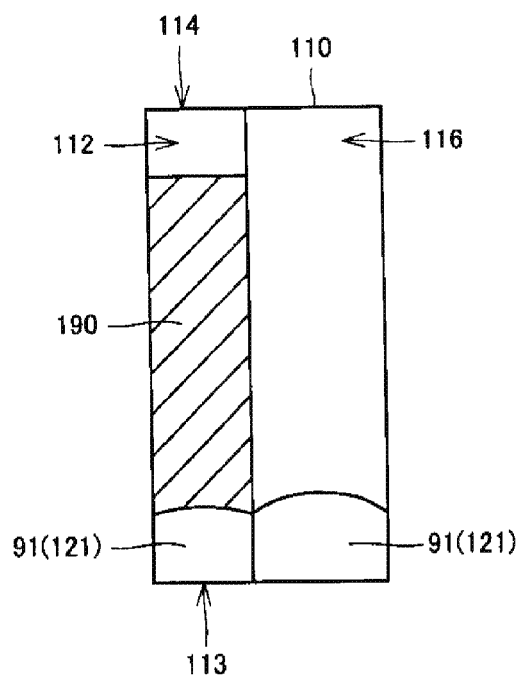
FIG. 11 is a side view illustrating the spread conductive paste applied around the first end surface.

FIG. 10 is a side view illustrating a conductive paste being applied around a first end surface of a laminated body. FIG. 11 is a side view illustrating the spread conductive paste applied around the first end surface.

As shown in FIG. 10, the first end surface 113 of the laminated body 110 with the lipophobic films 190 formed on only the first principal surface and the second principal surface is immersed in a conductive paste 91 put in a container 90. Specifically, the laminated body 110 is immersed in the conductive paste 91 until an end of the lipophobic film 190 closer to the first end surface 113 comes into contact with the conductive paste 91. Thus, the conductive paste is applied over from the first end surface 113 of the laminated body 110 to the first principal surface 111, second principal surface 112, first side surface 115, and second side surface 116 thereof.

The lipophobic films 190 prevent the conductive paste 91 from spreading out on the surface of the laminated body 110. Therefore, the conductive paste 91 applied to the first and second principal surfaces 111, 112 hardly spreads out on the lipophobic films 190.

When the laminated body 110 is pulled up from the inside of the container 90, the conductive paste 91 is applied around the first end surface 113 of the laminated body 110 as shown in FIG. 11. The conductive paste 91 applied to the first and second side surfaces 115, 116 spreads out to the second end surface, whereas the conductive paste 91 applied to the first and second principal surfaces 111, 112 hardly spreads out to the second end surface.

As a result, in the direction connecting the first end surface 113 and the second end surface 114 at the shortest distance (the length direction L of the laminated body 110), the maximum length La of the first sintered metal layer 121 provided on each of the first principal surface 111 and second principal surface 112 is shorter than the maximum length Ld of the second sintered metal layer 131 provided on each of the first side surface 115 and the second side surface 116.

Likewise, the second sintered metal layer 131 is provided around the second end surface 114 of the laminated body 110. As a result, in the direction connecting the first end surface 113 and the second end surface 114 at the shortest distance (the length direction L of the laminated body 110), the maximum length Lb of the second sintered metal layer 131 provided on each of the first principal surface 111 and the second principal surface 112 is shorter than the maximum length Le of the second sintered metal layer 131 provided on each of the first side surface 115 and the second side surface 116.

The metal component included in the conductive paste 91 is subjected to sintering by heating the laminated body 110 with the conductive paste 91 applied thereto. The heating temperature is preferably 700° C. or higher and 900° C. or lower, for example. It is to be noted that the lipophobic films 190 disappear in baking the conductive paste 91. Thus, it becomes possible to apply a conductive resin paste described below to the laminated body 110.

While the conductive paste 91 applied to both ends of the fired laminated body 110 preferably is baked to provide the first and second sintered metal layers 121, 131 in the present preferred embodiment, the conductive paste 91 applied to the both ends of the unfired soft laminated body may be subjected to co-firing with the conductor layers 140 to provide the first and second sintered metal layers 121, 131.

Next, the conductive resin paste is applied to both ends of the laminated body 110 with the first and second sintered metal layers 121, 131 provided, and subjected to thermal curing (S22). First, prepared are a thermosetting resin as a resin component, and the conductive resin paste which is a mixture including a conductive filler as a metal component.

Metal particles such as Cu or Ag, or metal particles such as Cu or Ni with surfaces coated with Ag can be used as the conductive filler. The metal particles of Cu may be subjected to antioxidant treatment.

The average particle size of the conductive filler is not particularly limited, but may be, for example, about 1.0 μm or more and about 10.0 μm or less. It is to be noted that the average particle size of the conductive filler refers to a particle size corresponding to about 50% of an integrated value in a particle size distribution obtained by a laser diffraction-scattering method.

The conductive filler provides conductivity for each of the first and second conductive resin layers 122, 132. Specifically, the conductive filler comes into contact with one another to define electrically conducting paths within each of the first and second conductive resin layers 122, 132.

The shape of the conductive filler is not particularly limited, but may be spherical or flattened. It is to be noted that the flattened shape of the conductive filler indicates that the outline of the conductive filler has an aspect ratio of 5:1 or more, for example. The shape of the conductive filler can be confirmed by observing the first and second conductive resin layers 122, 132 with the use of SEM (Scanning Electron Microscope) in a cross section LT exposed in such a way that the ceramic electronic component 100 subjected to surface treatment so as not to produce polishing shear drop or the like is polished to a central portion in the width direction W in parallel with the first side surface 115 or the second side surface 116.

As the conductive filler, a spherical conductive filler and a flattened conductive filler are preferably used in mixture.

In this case, the ratio between the particle number of the spherical conductive filler and the particle number of the flattened conductive filler preferably falls within the range of 3:7 to 7:3, for example.

When the ratio between the particle number of the spherical conductive filler and the particle number of the flattened conductive filler is higher than 7:3, electrical connection is ensured within each of the first and second conductive resin layers 122, 132, while the first and second conductive resin layers 122, 132 come to fail to function as buffer layers because of the excessively small amount of the flattened conductive filler.

When the ratio between the particle number of the spherical conductive filler and the particle number of the flattened conductive filler is lower than 3:7, electrical connection can be insufficiently ensured within each of the first and second conductive resin layers 122, 132 because of the excessively small amount of the spherical conductive filler, and the electrical conductivity of the pair of external electrodes is decreased to increase the equivalent series resistance (ESR: Equivalent Series Resistance) of the ceramic electronic component 100.

Various known thermosetting resins such as epoxy resins, phenolic resins, urethane resins, silicon resins, and polyimide resins can be used as the thermosetting resin. Among these resins, the epoxy resins are preferably used which have excellent heat resistance, moisture resistance, and adhesion, etc.

The conductive resin paste preferably contains a curing agent along with the thermosetting resin.

In the case of using an epoxy resin as a base resin, various curing agents can be used such as phenols, amines, acid anhydrides, or imidazoles.

The conductive resin paste is applied by various printing methods, dip methods, or the like so as to cover each of the first and second sintered metal layers 121, 131, and the laminated body 110 with the conductive resin paste applied is heated to cure the thermosetting resin.

The laminated body 110 with the conductive resin paste applied is preferably subjected to heating treatment in a neutral atmosphere such as a nitrogen gas atmosphere or other non-oxidizing atmosphere such as a reducing atmosphere.

Specifically, the laminated body 110 with the conductive resin paste applied is preferably heated under an atmosphere with an oxygen concentration of about 100 ppm or less, for example. The heating temperature is preferably 150° C. or higher and 300° C. or lower, for example.

In accordance with the step described above, the laminated body 110 is provided with the first and second conductive resin layers 122, 132.

Next, the laminated body 110 with the first and second conductive resin layers 122, 132 provided is subjected to Ni plating by an electrolytic plating method or the like (S23). Thus, first and second Ni plated layers 124, 134 are provided which respectively cover the first and second conductive resin layers 122, 132.

Furthermore, the laminated body 110 with the first and second Ni plated layers 124, 134 provided is subjected to Sn plating by an electrolytic plating method (S24). Thus, first and second Sn plated layers 125, 135 are provided which respectively cover the first and second Ni plated layers 124, 134.

Through the series of steps described above, the ceramic electronic component 100 which has the structure shown in FIGS. 1 to 7 is manufactured.

In the ceramic electronic component 100 according to the present preferred embodiment, in the direction connecting the first end surface 113 and the second end surface 114 at the shortest distance (the length direction L of the laminated body 110), the maximum length La of the first sintered metal layer 121 provided on the second principal surface 112 is shorter than the maximum length Ld of the first sintered metal layer 121 provided on each of the first side surface 115 and the second side surface 116. In addition, in the direction connecting the first end surface 113 and the second end surface 114 at the shortest distance (the length direction L of the laminated body 110), the maximum length Lb of the second sintered metal layer 131 provided on the second principal surface 112 is shorter than the maximum length Le of the second sintered metal layer 131 provided on each of the first side surface 115 and the second side surface 116.

As described above, when the ceramic electronic component 100 mounted on a circuit board is subjected to an external force, a combination of residual stress and external stress is concentrically loaded on portions of the laminated body 110 in contact with respective ends of the first and second sintered metal layers 121, 131 on the second principal surface 112 opposed to the circuit board.

Shrinkage stress that acts on portions of the laminated body 110 in contact with respective ends of the first and second sintered metal layers 121, 131 on the second principal surface 112 in baking the conductive paste can be reduced by making the maximum length La of the first sintered metal layer 121 provided on the second principal surface 112 shorter than the maximum length Ld of the first sintered metal layer 121 provided on each of the first side surface 115 and the second side surface 116, and making the maximum length Lb of the second sintered metal layer 131 provided on the second principal surface 112 shorter than the maximum length Le of the second sintered metal layer 131 provided on each of the first side surface 115 and second side surface 116. As a result, residual stress generated on portions of the laminated body 110 in contact with respective ends of the first and second sintered metal layers 121, 131 on the second principal surface 112 is significantly reduced or prevented.

Furthermore, in the ceramic electronic component 100 according to the present preferred embodiment, the height $T_1$ of the laminated body 110 is larger than the width $W_1$ of the laminated body 110. Therefore, the area of contact between the first and second sintered metal layers 121, 131 and the second principal surface 112 are smaller than the areas of contact between the first and second sintered metal layers 121, 131 and each of the first side surface 115 and the second side surface 116.

Thus, the shrinkage force which acts on the second principal surface 112 of the laminated body 110 in baking the conductive paste is smaller than the shrinkage force which acts on each of the first side surface 115 and the second side surface 116 of the laminated body 110 in baking the conductive paste.

As a result, cracks are prevented from being generated from portions of the laminated body 110 in contact with respective ends of the first and second sintered metal layers 121, 131 on the second principal surface 112.

In addition, when the ceramic electronic component 100 is mounted on a circuit board, the area of contact between the first and the second plated layers 123, 133 and a solder can be made larger at the first side surface 115 and the second side surface 116 than at the second principal surface 112. Thus, the joining force of a solder on the pair of external electrodes, which spreads upward on each of the first side surface 115 and second side surface 116, maintain the fixing strength between the ceramic electronic component 100 and the circuit board.

As described above, the maximum length La of the first sintered metal layer 121 and the maximum length Lb of the second sintered metal layer 131 are each preferably about 5 µm or more and about 110 µm or less, for example.

When the maximum length La of the first sintered metal layer 121 and the maximum length Lb of the second sintered metal layer 131 are each shorter than about 5 µm, the distance along the outer surface of the laminated body 110 between an end of the first sintered metal layer 121 and the first conductor layers 141 located at the first end surface 113, and the distance along the outer surface of the laminated body 110 between an end of the second sintered metal layer 131 and the second conductor layers 142 at the second end surface 114 each become excessively short, thereby resulting in insufficient moisture resistance. In this case, there is a possibility that moisture ingress from the outside will short-circuit the ceramic electronic component 100.

When the maximum length La of the first sintered metal layer 121 and the maximum length Lb of the second sintered metal layer 131 are each longer than about 110 µm, shrinkage stress can be insufficiently reduced which acts on portions of the laminated body 110 in contact with respective ends of the first and second sintered metal layers 121, 131 on the second principal surface 112 in baking the conductive paste.

As described above, the maximum length Ld of the first sintered metal layer 121 and the maximum length Le of the second sintered metal layer 131 are each preferably about 25 µm or more and about 145 µm or less, for example. When the maximum length Ld of the first sintered metal layer 121 and the maximum length Le of the second sintered metal layer 131 are each larger than about 145 µm, there is a possibility that residual stress generated on portions of the laminated body 110 in contact with respective ends of the first and second sintered metal layers 121, 131 at the first side surface 115 and the second side surface 116 will be increased to generate cracks.

Experimental examples will be described below for evaluating the influences of the relationships between the maximum lengths La, Lb and maximum lengths Ld, Le of the first and second sintered metal layers 121, 131 on crack generation in the ceramic electronic component and the fixing strength between the ceramic electronic component and the circuit board.

EXPERIMENTAL EXAMPLES

In the experimental examples, prepared were three types of ceramic electronic components according to Comparative Examples 1 and 2 and Example 1. First, conditions (designed values) common to the three types of ceramic electronic components will be described.

The external dimensions of the ceramic electronic components were adjusted to 1.1 mm in length $L_0$, 0.6 mm in width $W_0$, and 0.9 mm in thickness $T_0$. The first outer layer portion and the second outer layer portion were each adjusted to 40 µm in thickness. The thickness of the sintered metal layer was adjusted to 5 µm on the first and second principal surfaces 111, 112 and on the first and second side surfaces 115, 116, and to 10 µm on the first and second end surfaces 113, 114. The thickness of the conductive resin layer was adjusted to 10 µm on the first and second principal surfaces 111, 112 and on the first and second side surfaces 115, 116, and to 20 µm on the first and second end surfaces 113, 114. The thickness of the plated layer of the Ni plated layer and Sn plated layer combined was adjusted to 10 µm on the first and second principal surfaces 111, 112 and on the first and second side surfaces 115, 116, and to 7 µm on the first and second end surfaces 113, 114.

In the case of the ceramic electronic component according to Example 1, lipophobic films 190 of silicon-based resin were formed from a position at a distance of length Lx from the first end surface 113, to a position at a distance of length Lx from the second end surface, on only each of the first and second principal surfaces 111, 112 as shown in FIG. 9. The maximum lengths La, Lb of the first and second sintered metal layers 121, 131 were adjusted to 90 µm, and the maximum lengths Ld, Le thereof were adjusted to 110 µm.

In the case of the ceramic electronic component according to Comparative Example 1, no lipophobic film 190 was formed on any surface of the laminated body 110. The maximum lengths La, Lb of the first and second sintered metal layers 121, 131 were adjusted to 110 µm, and the maximum lengths Ld, Le thereof were adjusted to 110 µm.

In the case of the ceramic electronic component according to Comparative Example 2, lipophobic films 190 of silicon-based resin were formed from a position at a distance of length Lx from the first end surface 113, to a position at a distance of length Lx from the second end surface, on only each of the first and second side surfaces 115, 116. The maximum lengths La, Lb of the first and second sintered metal layers 121, 131 were adjusted to 110 µm, and the maximum lengths Ld, Le thereof were adjusted to 90 µm.

As shown in FIG. 2, each of the first and second sintered metal layers 121, 131 located on the first and second principal surfaces 111, 112 typically has a maximum length in a cross section LT including a central axis Lc of the laminated body 110. Therefore, the maximum length La, Lb of the first or second sintered metal layers 121, 131 are obtained by polishing the ceramic electronic component to expose a cross section LT passing through the central axis Lc of the laminated body 110, and observing the exposed cross section with an optical microscope to measure the length of the longest point of the first or second sintered metal layer 121, 131.

As shown in FIG. 3, each of the first and second sintered metal layers 121, 131 located on the first and second side surfaces 115, 116 typically has a maximum length in a cross section LW including the central axis Lc of the laminated body 110. Therefore, the maximum length Ld, Le of the first or second sintered metal layers 121, 131 are obtained by polishing the ceramic electronic component to expose a cross section LW passing through the central axis Lc of the laminated body 110, and observing the exposed cross section with an optical microscope to measure the length of the longest point of the first or second sintered metal layer 121, 131.

In the evaluation of crack generation in the ceramic electronic components, twenty pieces were prepared for each of the three types of ceramic electronic components, and the ceramic electronic components were evaluated as bad if there was any ceramic electronic component with a crack found to reach the conductor layer among the twenty pieces, as no good if there was any ceramic electronic component with a crack found to be generated among the twenty pieces while no crack was found to reach the conductor layer, or as good if the twenty pieces of ceramic electronic components were all found to generate no crack.

In the evaluation of crack generation in the ceramic electronic components, each of the three types of ceramic electronic components according to Comparative Examples 1 and 2 and Example 1 was mounted on a glass epoxy substrate, and the ceramic electronic components mounted were sealed with a resin. Each of the three types of ceramic electronic components according to Comparative Examples 1 and 2 and Example 1 was mounted so that the second principal surface 112 was opposed to the glass epoxy substrate, and the push amount of a suction nozzle of the mount machine was adjusted to 1.0 mm from a condition with the pair of external electrodes in contact with a solder paste for each ceramic electronic component.

Whether the ceramic electronic components were cracked or nor was confirmed by polishing each ceramic electronic component sealed with the resin, thereby exposing a cross section LT passing through the central axis Lc of the laminated body 110, and observing the exposed cross section with an optical microscope.

In the evaluation of the fixing strength between the ceramic electronic component and the circuit board, twenty pieces were prepared for each of the three types of ceramic electronic components, and the ceramic electronic components were evaluated as bad if there was any ceramic electronic component with insufficient fixing strength among the twenty pieces, or as good if the twenty pieces of laminated ceramic capacitors were all sufficient in fixing strength.

In the evaluation of the fixing strength between the ceramic electronic component and the circuit board, the ceramic electronic component was mounted with a solder on a glass epoxy substrate, and a pressing force was applied from a side surface of the ceramic electronic component to measure the force (fixing strength) required for peeling the ceramic electronic component from the glass epoxy substrate. Cases with fixing strength of 5 N or less were determined to be insufficient in fixing strength.

TABLE 1

|  | Example 1 | Comparative Example 1 | Comparative Example 2 |
|---|---|---|---|
| Maximum Length of Sintered Metal Layer on Principal Surface | 90 μm | 110 μm | 110 μm |
| Maximum Length of Sintered Metal Layer on Side Surface | 110 μm | 110 μm | 90 μm |
| Crack Generation | Good | Bad | No good |
| Fixing Strength | Good | Good | Bad |

Table 1 summarizes the evaluation results in the experimental examples. As shown in Table 1, the ceramic electronic component according to Example 1 with the maximum lengths La, Lb of the first and second sintered metal layers 121, 131 made shorter by about 20 μm than the maximum lengths Ld, Le has no crack generation found, and has sufficient fixing strength.

The ceramic electronic component according to Comparative Example 1 with the maximum length La, Lb of the first and second sintered metal layers 121, 131 comparable to the maximum lengths Ld, Le has sufficient fixing strength, but has a crack found to reach the conductor layer.

The ceramic electronic component according to Comparative Example 2 with the maximum lengths Ld, Le of the first and second sintered metal layers 121, 131 made shorter by 20 μm than the maximum lengths La, Lb has no crack found to reach any conductor layer, but has crack generation found, and insufficient fixing strength.

From the experimental results, it has been successfully confirmed that the laminated body 110 is prevented from being cracked by making the maximum length La of the first sintered metal layer 121 provided on the second principal surface 112 shorter than the maximum length Ld of the first sintered metal layer 121 provided on each of the first side surface 115 and the second side surface 116, and making the maximum length Lb of the second sintered metal layer 131 provided on the second principal surface 112 shorter than the maximum length Le of the second sintered metal layer 131 provided on each of the first side surface 115 and the second side surface 116.

In addition, it has been successfully confirmed that the fixing strength between the ceramic electronic component 100 and a circuit board is maintained by making the area of contact between the first and second plated layers 123, 133 and a solder larger at the first side surface 115 and the second side surface 116 than at the second principal surface 112, when the ceramic electronic component 100 is mounted on the circuit board.

The preferred embodiments disclosed herein should be considered by way of example in all respects, but not considered restrictive. The scope of the present invention is specified by the claims below, but not by the foregoing description, and intended to encompass all changes within the spirit and scope equivalent to the claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ceramic electronic component comprising:
a laminated body including a plurality of ceramic layers and a plurality of conductor layers that are stacked alternately; and
first and second external electrodes provided on portions of the laminated body, and electrically connected to at least some conductor layers of the plurality of conductor layers; wherein
the laminated body includes a first end surface and a second end surface opposing each other in a length direction, a first principal surface and a second principal surface opposing each other in a height direction, the first and second principal surfaces connecting the first end surface and the second end surface, and a first side surface and a second side surface opposing each other in a width direction, the first and second side surfaces connecting the first principal surface and the second principal surface and connecting the first end surface and the second end surface;
a height of the laminated body in the height direction is larger than a width of the laminated body in the width direction;
the first and second external electrodes each includes a sintered metal layer provided on the laminated body, a conductive resin layer including a mixture of a resin and a metal, the conductive resin layer provided on the sintered metal layer, and a plated layer provided on the conductive resin layer;
the first external electrode extends from the first end surface to at least a portion of the second principal surface, a portion of the first side surface, and a portion of the second side surface;

the second external electrode extends from the second end surface to at least a portion the second principal surface, a portion of the first side surface, and a portion of the second side surface;

the laminated body includes a first outer layer portion and a second outer layer portion having a height that is greater than a height of the first outer layer portion;

the second outer layer portion includes an outside outer layer portion and an inside outer layer portion;

a Si content ratio at a boundary portion between the outside outer layer portion and the inside outer layer portion is higher than that in a central portion of the outside outer layer portion;

an edge of the conductive resin layer of each of the first and second external electrodes disposed on the respective portion of at least one of the first and second side surfaces has a curved shape; and the conductive resin layer includes a conductive filler including conductive particles having a flattened or spherical shape.

2. The ceramic electronic component according to claim 1, wherein the conductive filler contains Cu or Ag.

3. The ceramic electronic component according to claim 1, wherein the conductive filler contains Cu.

4. The ceramic electronic component according to claim 1, wherein the plated layer includes a Ni plated layer provided on the conductive resin layer, and a Sn plated layer provided on the Ni plated layer.

5. The ceramic electronic component according to claim 1, wherein a maximum length of the sintered metal layer provided on the second principal surface is shorter by about 20 μm or more than a maximum length of the sintered metal layer provided on each of the first side surface and the second side surface.

6. The ceramic electronic component according to claim 1, wherein a direction of stacking of the plurality of ceramic layers and the plurality of conductor layers is one of parallel to the height direction and parallel to the width direction.

7. The ceramic electronic component according to claim 1, wherein the width of the laminated body is less than the length of the laminated body.

8. The ceramic electronic component according to claim 1, wherein the ceramic electronic component is one of a capacitor, a piezoelectric component, a thermistor, and an inductor.

9. The ceramic electronic component according to claim 1, wherein a thickness of each of the plurality of dielectric layers is about 0.5 μm or more and about 10 μm or less.

10. The ceramic electronic component according to claim 1, wherein the inside outer layer portion contains less Si than that included in the outside outer layer portion.

11. The ceramic electronic component according to claim 1, wherein the inside outer layer portion has a height that is less than a height of the outside outer layer portion.

12. The ceramic electronic component according to claim 1, wherein in the length direction, a maximum length of the sintered metal layer provided on the second principal surface is shorter than a maximum length of the sintered metal layer provided on each of the first side surface and the second side surface.

13. The ceramic electronic component according to claim 12, wherein the maximum length of the sintered metal layer provided on the second principal surface is about 5 μm or more and about 110 μm or less.

14. The ceramic electronic component according to claim 12, wherein the maximum length of the sintered metal layer provided on each of the first side surface and the second side surface is about 25 μm or more and about 145 μm or less.

15. The ceramic electronic component according to claim 1, wherein in the length direction, a maximum length of the conductive resin layer provided on the second principal surface is shorter than a maximum length of the conductive resin layer provided on each of the first side surface and the second side surface.

16. The ceramic electronic component according to claim 1, wherein an average particle size of the conductive particles is about 10.0 μm or less.

17. The ceramic electronic component according to claim 1, wherein the conductive resin layer is in direct contact with the sintered metal layer.

18. The ceramic electronic component according to claim 1, wherein the conductive resin layer completely covers the sintered metal layer.

19. The ceramic electronic component according to claim 1, wherein the plated layer is in direct contact with the conductive resin layer.

20. The ceramic electronic component according to claim 1, wherein the plated layer completely covers the conductive resin layer.

* * * * *